(12) United States Patent
Huang

(10) Patent No.: US 7,230,600 B1
(45) Date of Patent: Jun. 12, 2007

(54) REPAIRABLE MEMORY IN DISPLAY DEVICES

(75) Inventor: Samson X. Huang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 1276 days.

(21) Appl. No.: 09/675,067

(22) Filed: Sep. 28, 2000

(51) Int. Cl.
*G09G 3/36* (2006.01)

(52) U.S. Cl. .............. 345/88; 345/686; 711/202

(58) Field of Classification Search ........... 345/686, 345/88, 806; 711/202; 714/7
See application file for complete search history.

(56) References Cited

U.S. PATENT DOCUMENTS

| | | | | |
|---|---|---|---|---|
| 4,456,957 A | * | 6/1984 | Schieltz ................... | 710/4 |
| 5,153,574 A | * | 10/1992 | Kondo ..................... | 345/550 |
| 5,163,023 A | * | 11/1992 | Ferris et al. ............. | 365/200 |
| 5,633,816 A | * | 5/1997 | Wallace ................... | 708/252 |
| 5,805,604 A | * | 9/1998 | Nishikawa ............... | 714/701 |
| 5,898,826 A | * | 4/1999 | Pierce et al. ............. | 395/182.02 |
| 6,094,385 A | * | 7/2000 | Trimberger .............. | 365/200 |
| 6,202,180 B1 | * | 3/2001 | Nose ....................... | 714/718 |
| 6,317,817 B1 | * | 11/2001 | Shichiku et al. ........ | 711/202 |
| 6,330,693 B1 | * | 12/2001 | Lindsay ................... | 714/42 |

* cited by examiner

*Primary Examiner*—Albert Decady
*Assistant Examiner*—Fritz Alphonse
(74) *Attorney, Agent, or Firm*—Schwegman, Lundberg, Woessner & Kluth, P.A.

(57) ABSTRACT

A display system includes a repairable memory that re-routes data when a defect exists in the memory. A significant bit in the display memory that would otherwise be corrupted by a bad memory cell is re-routed to a least significant bit position in the memory, and the least significant information is discarded. The repairable memory includes a memory device and two repair routers. One repair router is on the input of the memory, and one repair router is on the output of the memory. One or more least significant bits can be sacrificed to preserve more significant bit information.

43 Claims, 5 Drawing Sheets

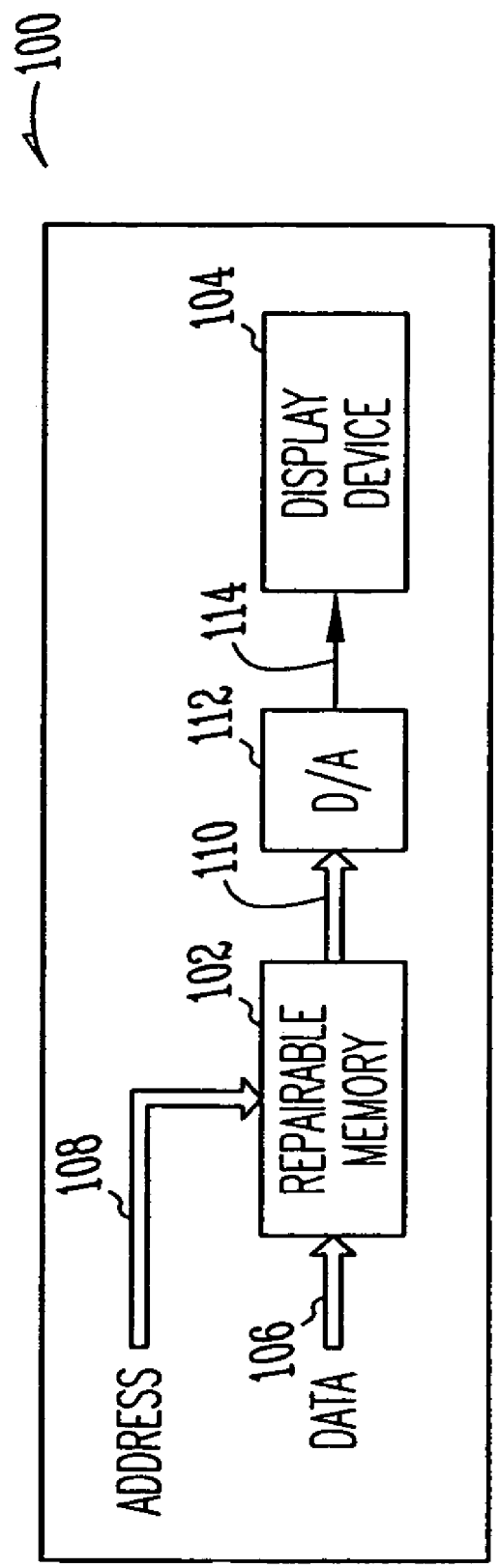

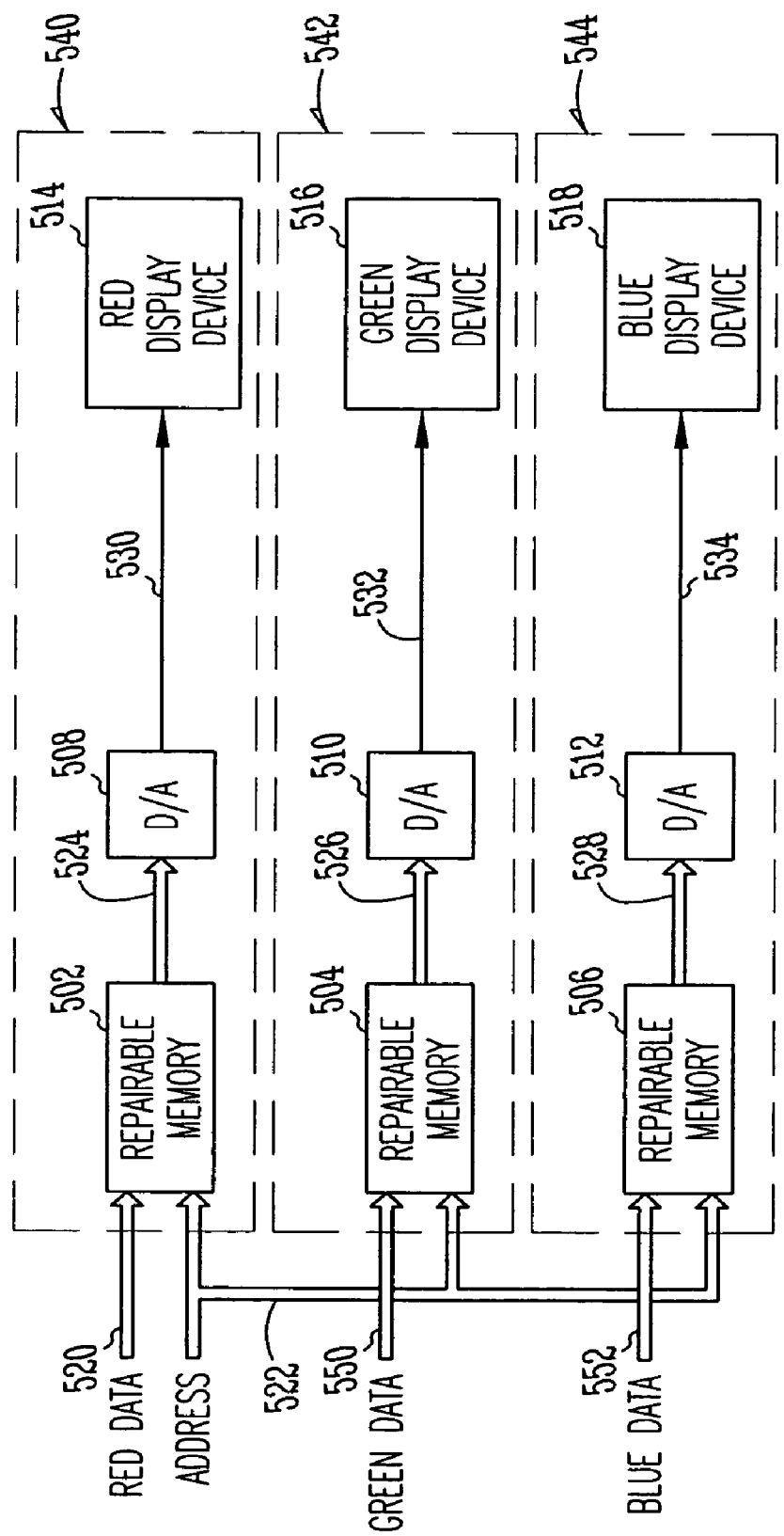

REPAIRABLE MEMORY IN DISPLAY DEVICES

FIELD

The present invention relates generally to memory devices, and more specifically to memory devices in display devices.

BACKGROUND

"Silicon Light Modulator" (SLM) is a term used to describe display devices that include a layer of liquid crystal (LC) sandwiched between a reflective electrode and a transparent top plane. The electrode and the layer of LC are organized as an array of pixels. When a voltage is changed on a pixel of the electrode, liquid crystals in the LC layer change their orientation and allow varying amounts of light to pass through. Each pixel can be controlled separately, and large displays can be made from large pixel arrays. Example SLMs are manufactured by Three-Five Systems Inc. of Tempe, Ariz.

Individual pixels in SLMs can be controlled by voltages that are generated using digital data. When 8 bits of digital data are used to control a single pixel, a gray scale with 256 levels can be created for each pixel. Memory devices such as random access memories can be used to hold digital information to influence the display. For example, a Static Random Access Memory (SRAM) device can be used to hold eight bits of information for each pixel in an array, and create 256 levels of gray scale for each pixel in the array.

As display sizes increase, the size of memory storage also increases. For example, a display having a resolution of 1280×1024 has approximately 1.3 million pixels, and the memory for storing pixel information is similarly large. Performance can be improved and costs of production can be lowered by coupling large memories more closely with the display devices that they drive, but one problem with coupling large memories too closely with display devices is that large memories often have defects introduced during manufacture. If a defective memory is coupled too closely with a display device, the display device may have to be discarded along with the defective memory after the memory defect is discovered.

For the reasons stated above, and for other reasons stated below which will become apparent to those skilled in the art upon reading and understanding the present specification, there is a need in the art for improved memories and display devices that can be closely coupled.

BRIEF DESCRIPTION OF THE DRAWINGS

FIG. 1 shows an integrated circuit display system;

FIG. 5 is a diagram of a color display system.

DESCRIPTION OF EMBODIMENTS

Figure 2A:
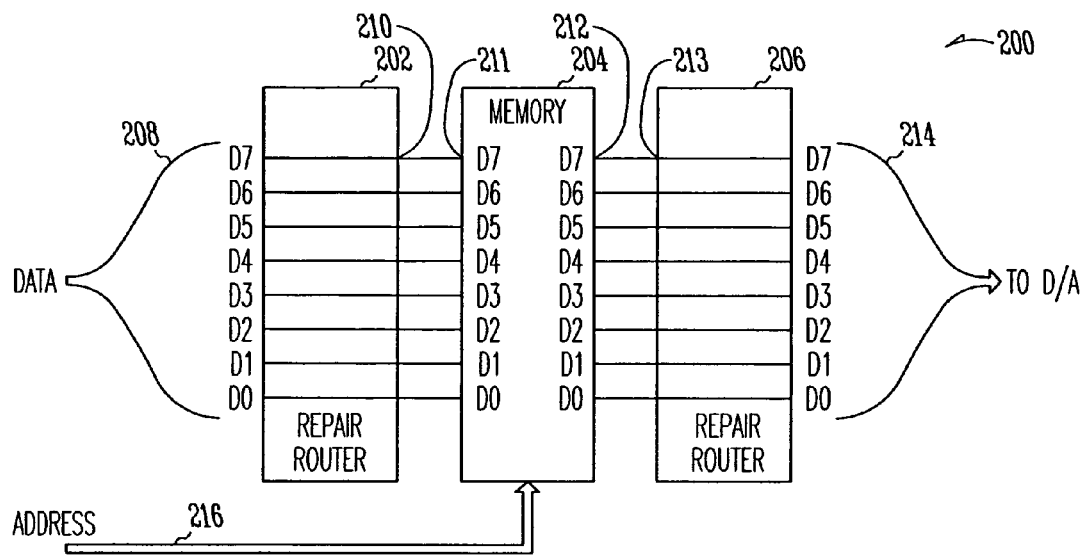
FIGS. 2A–2C show repairable memories with repair routers in various configurations.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to "repair" memories by utilizing the least significant bit of storage space to store more significant information when the memory cell for the more significant information is faulty. A "repair router" receives data and routes it into the memory. If the memory has a faulty memory cell that cannot reliably hold data, the repair router routes information otherwise destined for that memory cell into a memory cell that would otherwise hold least (or less) significant bit information. The repairable memory is useful in display systems where least significant bit information can be discarded without substantially degrading the quality of the display. For example, in non-color systems having eight bits per pixel, the least significant bit can be discarded while only losing 0.4% of the gray scale resolution.

FIG. 1 shows an integrated circuit display system. Integrated circuit 100 includes display device 104, digital-to-analog converter (D/A) 112, and repairable memory 102. Display device 104 is a display device that includes an array of pixels. Example display devices include silicon light modulators, liquid crystal displays, or any other type of display device having pixels. In some embodiments, display device 104 includes only that portion of the display device that is fabricated on integrated circuit 100. For example, in embodiments where display device 104 is a silicon light modulator, a reflective electrode can be manufactured as an integral part of the integrated circuit. The reflective electrode is arranged in an array of pixels, and can mate to a liquid crystal apparatus.

Display device 104 is driven by an analog signal on node 114, which is produced by D/A converter 112. D/A 112 receives digital data on bus 110 from repairable memory 102. Repairable memory 102 includes a plurality of memory locations, each of which holds data that influences a pixel in display device 104. In some embodiments, repairable memory 102 includes a number of memory locations equal to the number of pixels in display device 104. In other embodiments, repairable memory 102 includes more memory locations than pixels exist in display device 104.

In the embodiment of FIG. 1, a single analog voltage signal appears on node 114. In this embodiment, the analog voltage signal on node 114 is sequentially switched to each pixel in the array of display device 104. In some embodiments, a sample-and-hold circuit is included for each pixel, such that the analog voltage produced on node 114 is held for each pixel in display device 104. The analog voltage influencing each pixel in display device 104 is generated by D/A 112 as a result of data in repairable memory 102. In some embodiments, display device 104 is a gray scale device, and 8 bits of gray scale information are binary coded in repairable memory 102. In these embodiments, the most significant bit (MSB) determines the pixel brightness by 50%, and the least significant bit (LSB) determines the pixel brightness by $\frac{1}{256}$, or 0.4%.

Figure 2B:
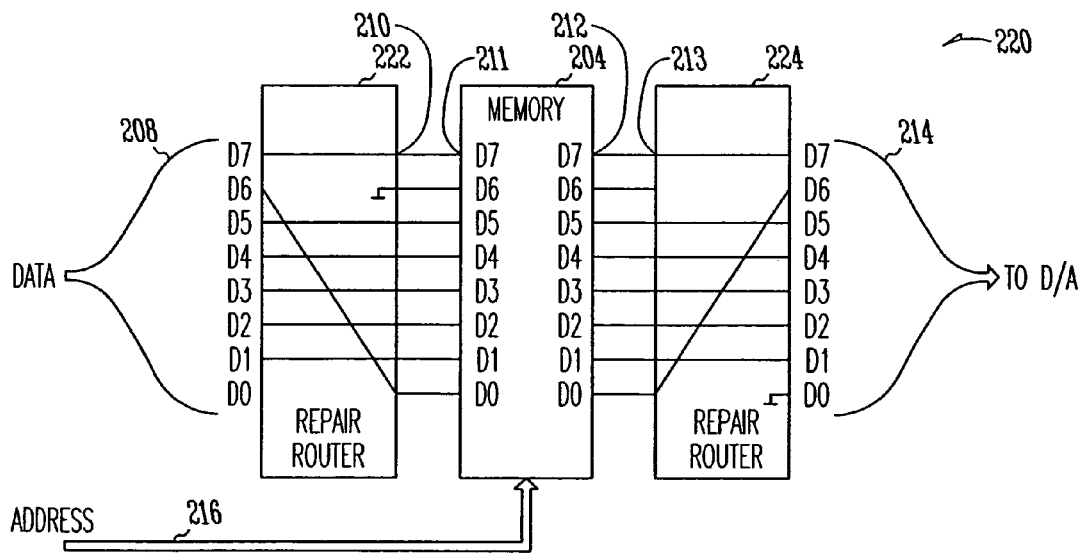
Figure 2C:
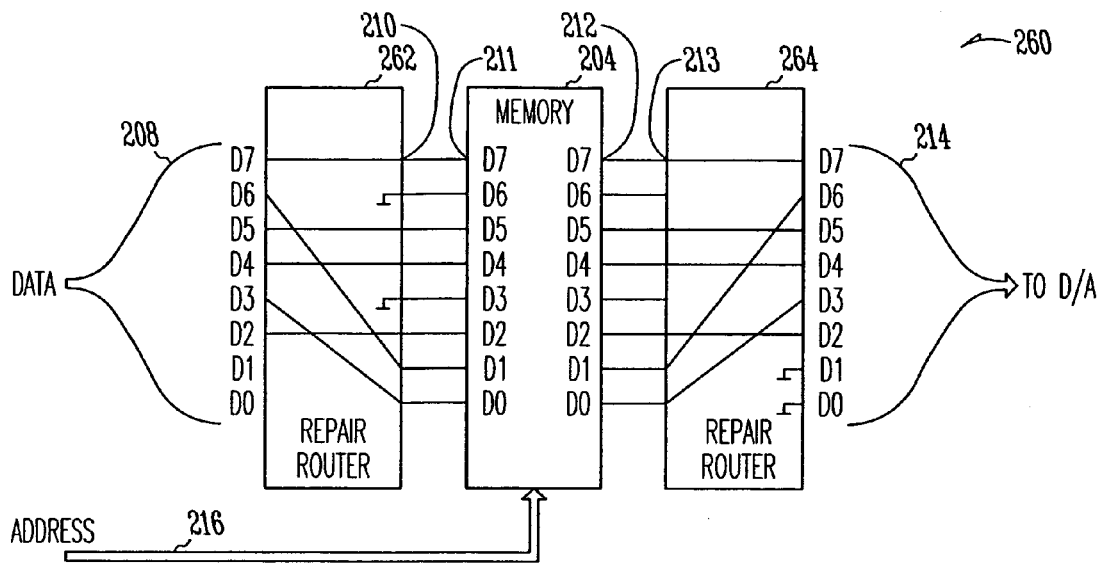

FIGS. 2A–2C show repairable memories with repair routers in various configurations. Repairable memory 200 includes memory device 204 and repair routers 202 and 206. In the embodiment shown in FIG. 2A, memory device 204 is a memory device having eight bits of information in each memory location. In other embodiments, memory device 204 is other than an eight bit device. Memory device 204 includes memory device input data bus 211. Memory device input data bus 211 is an eight bit data bus, labeled D7 through D0, where D7 represents the MSB and D0 represents the LSB. Memory device 204 also includes memory device output data bus 212, which is also an eight bit data bus labeled D7 through D0.

In the embodiment shown in FIG. 2A, memory device 204 is a dual port memory device. For example, memory device input data bus 211 is separate from memory device output data bus 212. In other embodiments, a single port memory device is utilized with appropriate multiplexing circuitry.

Memory device input data bus 211 is coupled to repair router 202 at repair router output data bus 210. Likewise, memory device output data bus 212 is coupled to repair router input data bus 213. Data bus 208, which corresponds to data bus 106 (FIG. 1) is input to repair router 202. Repair router 202 routes data information to memory 204. Memory 204, in turn, routes data to repair router 206, which sends data to the D/A converter on bus 214.

Repair router 202 includes internal circuitry to route any of the bits on the repair router input data bus to the LSB of the repair router output data bus. Repair router 206 includes internal circuitry to route the LSB of the repair router input data bus to any of the other bits on the repair router output data bus. In some embodiments, repair routers 202 and 206 also include internal circuitry to route any of the input bits to any of the output bits. The internal circuitry can be implemented in combinational logic such as multiplexors, demultiplexors and other logic gates.

In the embodiment shown in FIG. 2A, data is routed straight through repair routers 202 and 206. That is, the MSB of data bus 208 (D7) is routed straight through repair router 202, and is delivered to the MSB (D7) of memory device 204. Likewise, the MSB of memory device 204 (D7) is routed straight through repair router 206, and appears at the MSB (D7) of bus 214. This embodiment is useful when no defective locations exist within memory device 204. All eight bits of every location of memory device 204 are utilized to drive the D/A converter with bus 214. FIGS. 2B and 2C, described below, show configurations in which repair routers route data to overcome faulty memory locations within a memory device such as memory device 204.

Referring now to FIG. 2B, repairable memory 220 includes memory device 204, and repair routers 222 and 224. Repair routers 222 and 224 are the same repair routers as those shown in FIG. 2A, but are described with different reference numerals to indicate that they are performing different routing for data. For example, repair router 222 routes data from a non-least significant bit (D6) of the repair router input data bus to the LSB of the repair router output data bus. The LSB (D0) on the repair router input data bus is discarded, and the non-least significant bit was re-routed (D6) is driven in its place. D6 of the repair router output data bus is driven with a known voltage, such as a voltage that represents a valid logic value. Repair router 224 performs routing opposite to that provided by repair router 222. As a result, the original D6 is reproduced in its proper location on bus 214. The embodiment shown in FIG. 2B is useful when one or more memory cells within memory device 204 is defective. For example, if a memory cell corresponding to D6 within memory device 204 is defective, all bits that would otherwise go to the D6 location within memory device 204 are re-routed to the least significant position (D0) of memory device 204. This re-routing is performed by repair router 222. Repair router 224 performs the opposite routing function, and restores the bits that were re-routed.

As a result of the operation of repair routers 222 and 224, the LSB (D0) has been discarded to repair a faulty memory cell occurring in a more significant location within memory device 204. Without repair routers 222 and 224, data corresponding to D6 would be either corrupted or discarded, resulting in a display error of relatively large magnitude. By utilizing the LSB location within memory device 204 to store the more significant information that would otherwise be corrupted, least significant information is discarded rather than more significant information. As a result, a display device driven by data in repairable memory 220 can degrade gracefully.

Referring now to FIG. 2C, repairable memory 260 includes memory device 204 and repair routers 262 and 264. Repair routers 262 and 264, like repair routers 222 and 224 (FIG. 2B), are the same repair routers as those shown in FIG. 2A, but with different reference numerals to signify a different configuration. In the embodiment shown in FIG. 2C, two bits are re-routed by repair routers 262 and 264. Bits D6 and D3 of data bus 208 are re-routed to D1 and D0, respectively, of memory device 204 by repair router 262. The opposite routing is performed by repair router 264 to restore D6 and D3 to their proper position on bus 214.

The repair router configuration shown in FIG. 2C is useful when two bits in memory device 204 are defective. For example, when any combination of memory locations within memory device 204 have bits D6 and D3 defective, bits D0 and D1 are sacrificed to provide storage for the more significant bits D6 and D3. By sacrificing the least two significant bits, display intensity control drops by $\frac{1}{128}$ or 0.8%. This is more desirable than a more significant bit causing a larger error in intensity. Bits D6 and D3 are shown in FIG. 2C as an example; repair routers 262 and 264 can re-route any of the data bus bits to any of the bit locations within memory device 204.

Repairable memories such as those shown in FIGS. 2A–2C reduce the cost of display systems with embedded memories. When a display system such as display system 100 (FIG. 1) utilizes a repairable memory such as those shown in FIGS. 2A–2C, the need to discard defective memories (and more expensive display devices) is reduced, and costs are correspondingly reduced. In some embodiments, repairable memories such as those shown in FIGS. 2A–2C are embedded with display systems that include silicon light modulators. In these embodiments, the silicon light modulators, or a portion thereof, and the repairable memories are on the same integrated circuit.

FIGS. 2A–2C show a repairable memory device that includes repair routers that re-route data without regard to the address in the memory. For example, if one memory cell corresponding to D5 is defective in all of memory device 204, all LSBs D0 are sacrificed to provide storage space for D5. Stated differently, in the embodiments of FIGS. 2A–2C, memory device 204 receives address information from address bus 216, but the repair routers do not. The embodiments of FIGS. 3A and 3B, described below, differ from the embodiments of FIGS. 2A–2C in this respect.

Figure 3A:
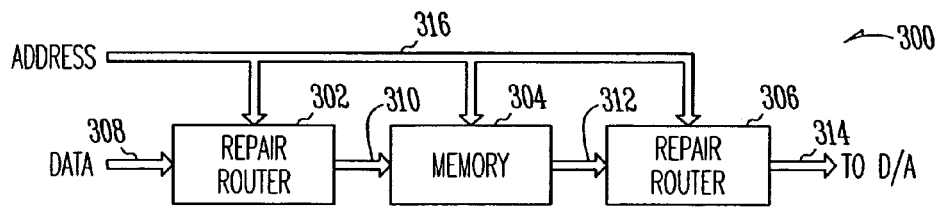
FIG. 3A shows a repairable memory having address ranges.

FIG. 3A shows a repairable memory having address ranges. Repairable memory 300 includes memory 304 and repair routers 302 and 306. Repair router 302 receives data on bus 308, conditionally re-routes it, and drives the data onto bus 310. Memory device 304 receives the data on bus 310 and stores it. Memory device 304 drives bus 312, which is input to repair router 306. Repair router 306 reverses any routing performed by repair router 302, and drives data onto bus 314. Memory device 304 operates the same as memory device 204 (FIG. 2A). In the embodiment shown in FIG. 3A, memory device 304 is a dual port memory device that receives data on data bus 310 and outputs data on data bus 312. Memory device 304 also receives address information on address bus 316.

Repair routers 302 and 306 include internal routing circuitry to route data away from defective memory cells as previously described. Repair routers 302 and 306 also receive address information on address bus 316. The address information can be used to divide memory 304 into any number of address ranges that can be re-routed separately. Each address range includes a number of memory locations. For example, if one bit of address information (the MSB) is used by repair routers 302 and 306, then memory device 304 can be divided into two address ranges: the lower half of the memory locations, and the upper half of the memory locations. Also for example, if two bits of address information are used by repair routers 302 and 304, then memory device 304 can be divided into four address ranges. Any number of address ranges can be created in this manner. In embodiments where the repair routers use all address bits, then the number of address ranges equals the number of memory locations, and each range includes a single memory location. In this embodiment, each memory location can have a unique routing to overcome defective memory cells.

Figure 3B:
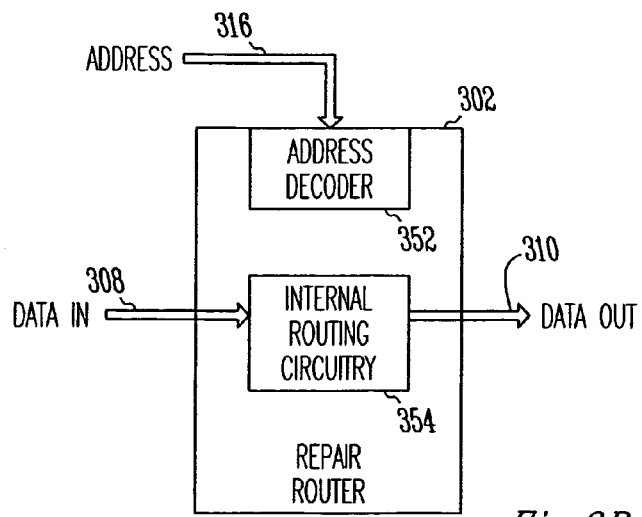
FIG. 3B shows a repair router having address ranges.

FIG. 3B shows a repair router having address ranges. Repair router 302 includes address decoder 352 and internal routing circuitry 354. Address decoder 352 receives address information on address bus 316, and decodes one or more address regions. The address range currently being decoded is communicated to internal routing circuitry 354. Internal routing circuitry 354 responds to the address currently being decoded by re-routing data received on bus 308, and sending the re-routed data out on bus 310. As described above with reference to FIG. 3A, any number of address bits can be decoded. In general, when n address bits are decoded, then $2^n$ address ranges are capable of having separate routing configurations.

Figure 4:
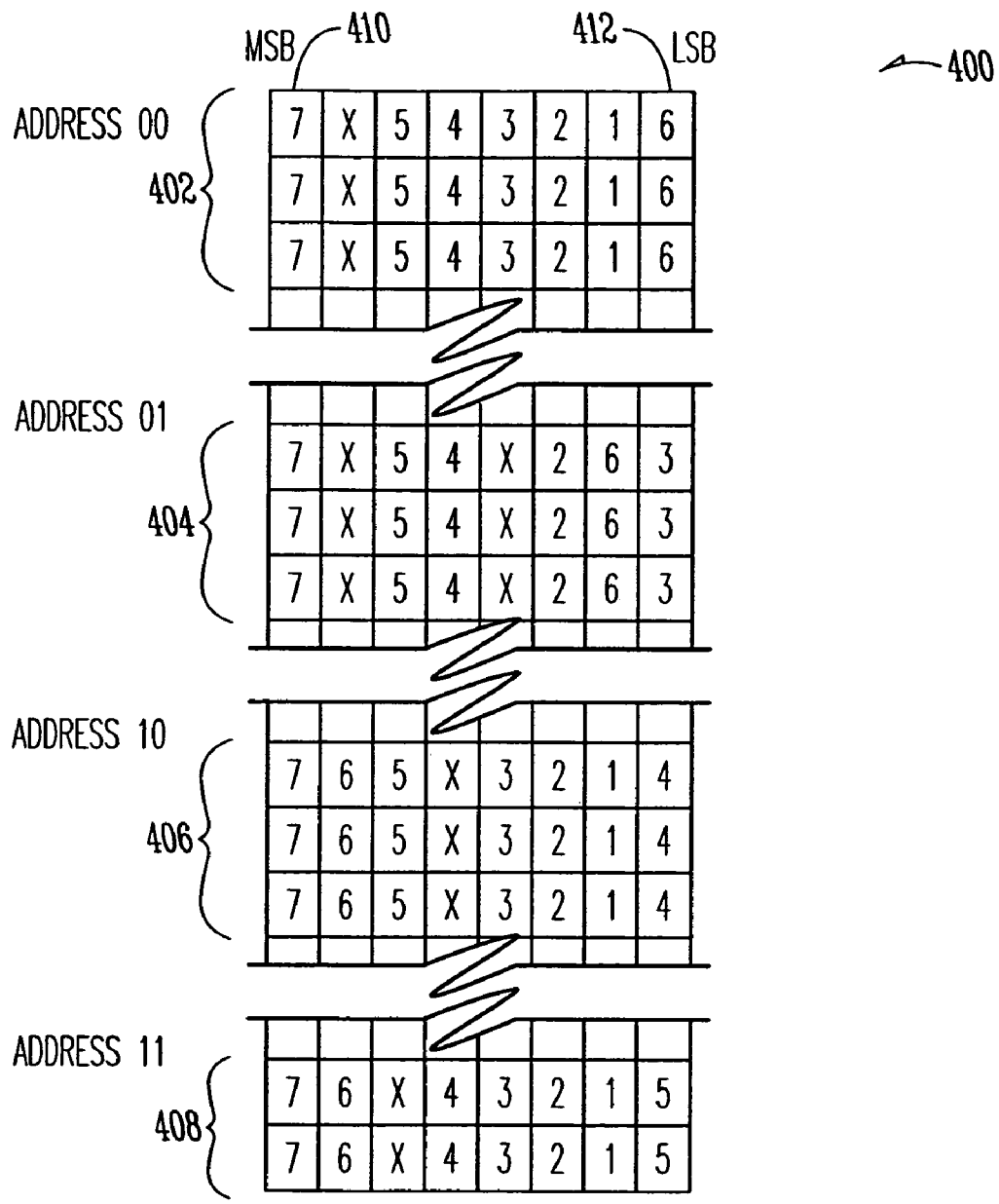
FIG. 4 shows a memory having address ranges.

FIG. 4 shows a memory having address ranges. Memory 400 is shown having four address ranges 402, 404, 406, and 408. Four address ranges corresponds to repair routers decoding 2 bits of address information. Each of address ranges 402, 404, 406, and 408 are also labeled "address nn," where nn refers to the two address bits being decoded. For example, address range 402 is shown as address 00, address range 404 is shown as address 01, address range 406 is shown as address 10, and address range 408 is shown as address 11.

Each memory location shown in FIG. 4 has eight memory cells, each holding a single bit. The MSB of each location is shown at column 410 and the LSB of each location is shown at column 412. Each memory cell is also shown having a number or an 'x.' The number indicates the weight of the data stored in the cell, and an 'x' indicates that no data is stored. For example, a '7' in a memory cell indicates a data bit corresponding to D7 (the most significant data bit) is stored in the memory cell. Also for example, a '0' stored in a memory cell indicates that a data bit corresponding to D0 (the least significant data bit) is stored in the cell.

In the embodiment of FIG. 4, each address range has undergone a different routing by a repair router. For example, address range 402 has D6 re-routed to the D0 position. This corresponds to a faulty memory cell in a D6 memory cell somewhere in address range 402. Address range 404 has D3 re-routed to the D0 position, and D6 re-routed to the D1 position. In a like manner, address range 406 has D4 re-routed to the D0 position, and address range 408 has D5 re-routed to the D0 position.

The example embodiment of FIG. 4 corresponds to a repair router that decodes two address bits and creates four address ranges. Any number of bits can be decoded, and any number of address ranges can be created without departing from the scope of the present invention.

FIG. 5 is a diagram of a color display system. The color display system of FIG. 5 includes red display system 540, green display system 542, and blue display system 544. Red display system 540 includes repairable memory 502, D/A converter 508, and red display device 514. Repairable memory 502 drives D/A converter 508 on node 524, and D/A converter 508 drives red display device 514 on node 530. Green display system 542 includes repairable memory 504, D/A converter 510, and green display device 516. Repairable memory 504 drives D/A converter 510 on node 526, and D/A converter 510 drives green display device 516 on node 532. Blue display system 544 includes repairable memory 506, D/A converter 512, and blue display device 518. Repairable memory 506 drives D/A converter 512 on node 528, and D/A converter 512 drives blue display device 518 on node 534. Each of repairable memories 502, 504, and 506 can be any repairable memory embodiment of the present invention.

In some embodiments, each display system 540, 542, and 544 is a separate silicon light modulator display. Also in some embodiments, the color display system of FIG. 5 is on a single integrated circuit. The repairable memories and the D/A converters are on a single integrated circuit, as is all or a portion of display devices 514, 516, and 518. For example, when the color display device is a silicon light modulator, a reflective electrode can be an integral part of the integrated circuit that interfaces to a non-integral liquid crystal apparatus.

When repairable memories 502, 504, and 506 are on the same integrated circuit as display devices 514, 516, and 518, manufacturing costs and the size of the display can be reduced. Repairable memories closely coupled to the display devices on the same integrated circuit can be "repaired" when memory locations are faulty, and the whole display system need not be discarded.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
   a memory device having a memory device input data bus including a least significant bit and a plurality of non-least significant bits; and
   a first repair router having a first repair router input data bus including a least significant bit and a plurality of non-least significant bits, and a first repair router output data bus coupled to the memory device input data bus, the first repair router having internal routing circuitry to route any of the plurality of non-least significant bits of the first repair router input data bus to the least significant bit of the memory device input data bus and to discard the least significant bit of the first repair router input data bus.

2. The apparatus of claim 1 wherein:
the plurality of non-least significant bits of the memory device input data bus includes a next-to-least significant bit; and
the first repair router further includes additional repair routing circuitry to route any of the non-least significant bits of the first repair router input data bus to the next-to-least significant bit of the memory device input data bus.

3. The apparatus of claim 2 wherein:
the first repair router further includes additional repair routing circuitry to discard a next-to-least significant bit of the first repair router input data bus.

4. The apparatus of claim 1 wherein the memory device includes a memory device output data bus including a least significant bit and a plurality of non-least significant bits, the apparatus further comprising:
a second repair router having a second repair router input data bus coupled to the memory device output data bus, and having a second repair router output data bus including a least significant bit and a plurality of non-least significant bits, the second repair router having internal routing circuitry to route the least significant bit of the memory device output data bus to any of the plurality of non-least significant bits of the second repair router output data bus.

5. The apparatus of claim 4 wherein the memory device includes a plurality of address ranges, and the first and second repair routers include address decoding circuitry to decode each of the plurality of address ranges.

6. The apparatus of claim 5 wherein the memory device includes two address ranges defined by a state of a most significant address bit.

7. The apparatus of claim 4 further comprising a display device coupled to the second repair router output data bus.

8. The apparatus of claim 7 wherein the display device is a color display device, and the memory device and first and second repair routers influence a first color of the color display device, the apparatus further comprising:
a second memory device; and
a second pair of repair routers coupled to the second memory device to influence a second color of the color display device.

9. The apparatus of claim 8 further comprising:
a third memory device; and
a third pair of repair routers coupled to the third memory device to influence a third color of the color display device.

10. A memory device comprising:
a plurality of addressable memory locations, each including a least significant bit and a plurality of non-least significant bits; and
a first repair router having a repair router input data bus with a least significant bit and a plurality of non-least significant bits, and having a repair router output data bus coupled to the plurality of addressable memory locations, the first repair router including routing circuitry to route any of the plurality of non-least significant bits of the repair router input data bus to the least significant bit of at least one of the plurality of addressable memory locations and to discard the least significant bit of the repair router input data bus.

11. The memory device of claim 10 wherein:
the plurality of addressable memory locations are arranged into a plurality of address ranges; and
the first repair router further includes address decoding circuitry to decode each of the plurality of address ranges.

12. The memory device of claim 11 further comprising a second repair router coupled to an output data bus of the memory device, the second repair router including routing circuitry to reverse any routing performed by the first repair router.

13. The memory device of claim 10 wherein the first repair router is configured to route a specific non-least significant bit to the least significant bit of the plurality of addressable memory locations when a problem exists with the specific non-least significant bit in at least one of the plurality of addressable memory locations.

14. The memory device of claim 10 further comprising a second repair router coupled to an output data bus of the memory device, the second repair router including routing circuitry to reverse any routing performed by the first repair router.

15. The memory device of claim 10 wherein:
the plurality of non-least significant bits of each of the addressable memory locations includes a next-to-least significant bit; and
the first repair router further includes routing circuitry to route any of the plurality of non-least significant bits of the repair router input data bus to the next-to-least significant bit of at least one of the plurality of addressable memory locations.

16. The memory device of claim 15 wherein:
the first repair router further includes routing circuitry to discard a next-to-least significant bit of the repair router input data bus.

17. A display system comprising:
a display device having an array of pixels;
a memory having a plurality of addresses, each of the plurality of addresses corresponding to one pixel in the array of pixels, and each of the plurality of addresses including a least significant data bit and a plurality of non-least significant data bits; and
a first repair router to utilize the least significant data bit of at least one of the plurality of addresses to hold non-least significant information from any of the plurality of non-least significant data bits and to discard least significant information.

18. The display system of claim 17 wherein the display device is a silicon light modulator.

19. The display system of claim 17 wherein the memory is configured to hold a first color information, the display system further comprising:
a second memory configured to hold second color information; and
a second repair router coupled to the second memory.

20. The display system of claim 19 further comprising:
a third memory configured to hold third color information; and
a third repair router coupled to the third memory.

21. The display system of claim 17 wherein:
the plurality of addresses are arranged in a plurality of groups; and
the first repair router includes routing circuitry to utilize the least significant bits of each of the plurality of groups separately.

22. An integrated circuit comprising:
a first memory device having an input data bus and an output data bus;
first and second repair routers coupled to the input data bus and the output data bus, respectively, the first and second repair routers including routing circuitry to route data to and from the first memory device as a function of defects in the first memory device; and
wherein the first and second repair routers include internal routing circuitry to utilize a least significant bit of the first memory device as a non-least significant bit and to discard least significant information.

23. The integrated circuit of claim 22 further comprising a reflective electrode coupled to the first memory device, the reflective electrode having a plurality of pixels responsive to data from the first memory device as received by the second repair router.

24. The integrated circuit of claim 23 wherein:
the first memory device includes a plurality of groups of data locations; and
the first and second repair routers each include circuitry to separately route data for each of the plurality of groups of data locations.

25. The integrated circuit of claim 24 further comprising:
second and third memory devices; and
second and third pairs of repair routers coupled to the second and third memory devices respectively.

26. A color display system comprising:
a green display device;
a first repairable memory coupled to the green display device to drive the green display device;
a blue display device;
a second repairable memory coupled to the blue display device to drive the blue display device;
a red display device;
a third repairable memory coupled to the red display device to drive the red display device; and
wherein the first repairable memory, the second repairable memory, and the third repairable memory each comprise:
a plurality of addressable memory locations, each including a least significant bit and a plurality of non-least significant bits;
a first repair router having a repair router input data bus with a least significant bit and a plurality of non-least significant bits, and having a repair router output data bus coupled to the addressable memory locations, the first repair router including routing circuitry to route any of the plurality of non-least significant bits of the repair router input data bus to the least significant bit of at least one of the addressable memory locations and to discard the least significant bit of the repair router input data bus; and
a second repair router coupled to an output data bus of the addressable memory locations, the second repair router including routing circuitry to reverse any routing performed by the first repair router.

27. The color display system of claim 26 wherein:
the addressable memory locations are arranged into a plurality of address ranges; and
the first repair router further includes address decoding circuitry to decode each of the plurality of address ranges.

28. The color display system of claim 26 wherein the green display device, the red display device, the blue display device, the first repairable memory, the second repairable memory, and the third repairable memory are located in a single integrated circuit.

29. The color display system of claim 26 wherein the first repair router is configured to route a specific non-least significant bit to the least significant bit of the addressable memory locations when a problem exists with the specific non-least significant bit in at least one of the addressable memory locations.

30. The color display system of claim 26 further comprising:
a first D/A converter coupled between the first repairable memory and the green display device to drive the green display device with an analog signal generated from digital data in the first repairable memory;
a second D/A converter coupled between the second repairable memory and the blue display device to drive the blue display device with an analog signal generated from digital data in the second repairable memory; and
a third D/A converter coupled between the third repairable memory and the red display device to drive the red display device with an analog signal generated from digital data in the third repairable memory.

31. The color display system of claim 26 wherein:
the plurality of non-least significant bits of each of the addressable memory locations includes a next-to-least significant bit; and
the first repair router further includes routing circuitry to route any of the plurality of non-least significant bits of the repair router input data bus to the next-to-least significant bit of at least one of the plurality of addressable memory locations.

32. A method comprising:
receiving digital data including a least significant bit and a plurality of non-least significant bits;
routing any of the non-least significant bits to a least significant bit of a memory device; and
discarding the least significant bit.

33. The method of claim 32 wherein:
receiving digital data further comprises receiving a next-to-least significant bit; and
routing further comprises routing any of the non-least significant bits to a next-to-least significant bit of the memory device.

34. The method of claim 32, further comprising routing a least significant bit of the memory device to any of a plurality of non-least significant bits of an output data bus of a repair router.

35. The method of claim 32, further comprising decoding each of a plurality of address ranges in the memory device.

36. The method of claim 32, further comprising driving a display device with digital data from the memory device.

37. The method of claim 32, further comprising driving a color display device with digital data from the memory device to influence a color of the color display device.

38. A method comprising:
driving a display device having an array of pixels with signals generated from information;
storing the information in a first memory having a plurality of addresses, each of the plurality of addresses corresponding to one pixel in the array of pixels, and each of the plurality of addresses including a least significant location and a plurality of non-least significant locations;
storing a non-least significant data bit of the information in the least significant location of at least one of the plurality of addresses; and discarding a least significant data bit of the information.

39. The method of claim 38, further comprising routing a data bit from the least significant location of one of the plurality of addresses to any of a plurality of non-least significant locations of an output data bus of a repair router.

40. The method of claim 38 wherein driving a display device further comprises driving a silicon light modulator.

41. The method of claim 38 wherein:
storing the information further comprises storing first color information in the first memory; and
further comprising:
storing second color information in a second memory; and
storing third color information in a third memory.

42. The method of claim 38 wherein:
storing the information further comprises storing the information in the first memory in the addresses arranged in a plurality of groups of addresses; and
storing a non-least significant data bit further comprises storing non-least significant data bits of the information in least significant locations in each of the groups separately.

43. The method of claim 38, further comprising storing a non-least significant data bit of the information in a next-to-least significant location of at least one of the plurality of addresses.

* * * * *